US010971541B2

(12) United States Patent
Colbeth et al.

(10) Patent No.: US 10,971,541 B2
(45) Date of Patent: Apr. 6, 2021

(54) DETECTOR ARCHITECTURE USING PHOTODETECTOR ARRAYS ON THINNED SUBSTRATES

(71) Applicant: Varex Imaging Corporation, Salt Lake City, UT (US)

(72) Inventors: Rick E. Colbeth, San Jose, CA (US); Ivan P. Mollov, San Jose, CA (US)

(73) Assignee: Varex Imaging Corporation, Salt Lake City, UT (US)

( * ) Notice: Subject to any disclaimer, the term of this patent is extended or adjusted under 35 U.S.C. 154(b) by 0 days.

(21) Appl. No.: 15/851,528

(22) Filed: Dec. 21, 2017

(65) Prior Publication Data
US 2019/0198556 A1   Jun. 27, 2019

(51) Int. Cl.
| | |
|---|---|
| H01L 27/14 | (2006.01) |
| H01L 27/146 | (2006.01) |
| H01L 31/18 | (2006.01) |
| H01L 23/00 | (2006.01) |
| G01T 1/20 | (2006.01) |

(52) U.S. Cl.
CPC ...... *H01L 27/14663* (2013.01); *G01T 1/2018* (2013.01); *H01L 24/16* (2013.01); *H01L 24/48* (2013.01); *H01L 24/73* (2013.01); *H01L 27/1469* (2013.01); *H01L 27/14634* (2013.01); *H01L 27/14636* (2013.01); *H01L 27/14687* (2013.01); *H01L 31/1892* (2013.01); *H01L 27/14661* (2013.01); *H01L 2224/16145* (2013.01); *H01L 2224/48091* (2013.01); *H01L 2224/48137* (2013.01); *H01L 2224/73207* (2013.01); *H01L 2224/73257* (2013.01); *H01L 2924/00014* (2013.01)

(58) Field of Classification Search
CPC .. H01L 27/14663; H01L 24/16; G01T 1/2018
See application file for complete search history.

(56) References Cited

U.S. PATENT DOCUMENTS

| | | | | |
|---|---|---|---|---|
| 5,173,443 | A | * | 12/1992 | Biricik ..................... G02B 1/10 438/72 |
| 5,684,308 | A | * | 11/1997 | Lovejoy .............. H01L 27/1443 257/184 |
| 7,375,341 | B1 | | 5/2008 | Nagarkar |
| 7,972,885 | B1 | * | 7/2011 | Dutta ..................... B82Y 20/00 257/E21.007 |
| 9,466,638 | B2 | | 10/2016 | Vora |

(Continued)

OTHER PUBLICATIONS

PCT/US2018/066050, International Search Report dated Apr. 29, 2019.

*Primary Examiner* — Hugh Maupin
(74) *Attorney, Agent, or Firm* — Laurence & Phillips IP Law (57) ABSTRACT

Some embodiments include a method, comprising: attaching a carrier substrate to a side of at least one semiconductor substrate, the at least one semiconductor substrate including photodetectors on the side; thinning the at least one semiconductor substrate while the at least one semiconductor substrate is attached to the carrier substrate; attaching an optical substrate to the at least one semiconductor substrate while the at least one semiconductor substrate is attached to the carrier substrate; and removing the carrier substrate from the at least one semiconductor substrate.

20 Claims, 10 Drawing Sheets

(56) References Cited

U.S. PATENT DOCUMENTS

| | | |
|---|---|---|
| 2003/0209652 A1 | 11/2003 | Fujii |
| 2003/0218120 A1* | 11/2003 | Shibayama ......... H01L 27/1464 250/214.1 |
| 2009/0224161 A1* | 9/2009 | Fritsch .................... G02B 6/08 250/370.09 |
| 2009/0275152 A1* | 11/2009 | Rommeveaux ....... B81C 1/0023 438/25 |
| 2010/0108893 A1* | 5/2010 | Flitsch ................ H01L 27/1463 250/361 R |
| 2015/0206917 A1 | 7/2015 | Chiu |
| 2016/0141318 A1 | 5/2016 | Van Arendonk |
| 2017/0287793 A1* | 10/2017 | Mauer .................... G06F 17/11 |

\* cited by examiner

DETECTOR ARCHITECTURE USING PHOTODETECTOR ARRAYS ON THINNED SUBSTRATES

BACKGROUND

This disclosure relates to detector architectures using photodetector arrays on thinned substrates.

Back side illuminated photodetector arrays use thinned substrates. The thinned substrate reduces an effect of the substrate on illumination that passes through the substrate to the photodetectors. The thinned substrates may be on the order of 10 μm. As a result, the thinned substrate is fragile and may break during later processing.

DETAILED DESCRIPTION

In some embodiments, a backside illuminated detector may include a substrate that has been thinned. The thinning reduces an amount of the substrate that incident illumination must penetrate to reach photodetectors disposed on a front side of the substrate. As a result, losses due to the substrate may be reduced. However, such thinning reduces the structural integrity of the substrate. For example, the substrate may be thinned to a thickness of about 10 μm. The original substrate may have a width that is 20 cm or a factor of 20000 greater than the thickness of the thinned substrate. As a result, the substrate may be relatively fragile. As will be described in further detail below, an optical substrate may provide structural support for such a substrate.

Figure 1:
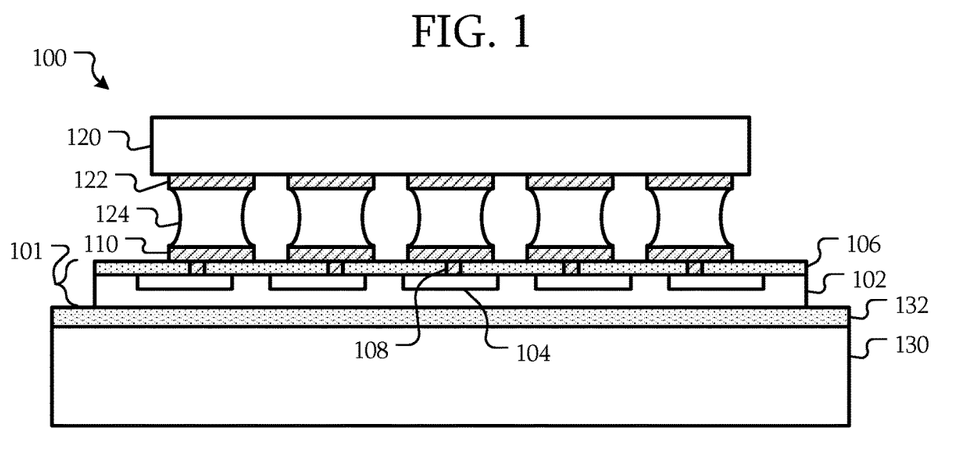
FIG. 1 is a block diagram of a detector using a thinned substrate according to some embodiments.

FIG. 1 is a block diagram of a detector using a thinned substrate according to some embodiments. Detector 100 includes a first semiconductor device 101, a second semiconductor device 120, and an optical substrate 130.

The first semiconductor device 101 may be a semiconductor wafer a semiconductor chip, or the like. The first semiconductor device 101 includes a thinned substrate 102. The thinned substrate 102 may include silicon, amorphous silicon, glass, another substrate on which semiconductor devices may be formed, or the like.

The thinned substrate 102 includes multiple photodetectors 104. The photodetectors 104 are semiconductor structures configured to convert incident illumination into electrons, current, voltage, or the like. For example, the photodetectors 104 may include photodiodes, photo transistors, or the like. Although a particular number of photodetectors 104 has been used as an example, in other embodiments the number may be different. Moreover, although photodetectors 104 have been illustrated in a line, the photodetectors 104 may be disposed in a variety of configurations. For example, the photodetectors 104 may be disposed in an array.

The photodetectors 104 may be formed on or in the thinned substrate 102. Here, the photodetectors 104 are illustrated as being formed in the thinned substrate 102; however, in other embodiments, the photodetectors 104 may be formed differently. An isolation layer 106 is disposed on a surface of the thinned substrate 102. A plurality of vias 108 electrically connect the photodetectors 104 to pads 110 formed on the thinned substrate 102. The vias 108 and pads 110 may include conductive materials such as metal, polysilicon, or the like.

Although the first semiconductor device 101 has been described as having a particular structure with photodetectors 104 connected to pads 110 through vias 108, in other embodiments, the structure of the first semiconductor device 101 may be different. For example, one or more wiring layers, other circuits and components, or the like may be formed in or on the thinned substrate 102.

The first semiconductor device 101 may be a sensor of the detector 100. As will be described in further detail below, the first semiconductor device 101 may be a sensor for an x-ray detector. However, in other embodiments, the detector 100 may be used in application that do not use x-rays, such as visible light detection, infrared light detection, range finding, or the like.

In particular, the thinned substrate 102 may have a thickness on the order of tens of micrometers. In some embodiments, the thinned substrate 102 may have a thickness of about 10 μm. In other embodiments the thinned substrate 102 may have a thickness of less than about 30 μm. For human or animal x-ray applications (e.g., medical or veterinary applications), a thinned substrate 102 having a thickness greater than about 30 μm may significantly attenuate the x-rays passing through the thinned substrate 102 so detected quantum efficiency (DQE) of the detector 100 is reduced. Although particular examples of thicknesses of the thinned substrate 102 have been given, in other embodiments, the thinned substrate 102 may have other thicknesses. However, the thickness relative to the other dimensions of the thinned substrate 102 may result in the thinned substrate 102, without structural support, which can be damaged during processing. For example, such subsequent processing may include scintillator deposition, lamination or compression coupling, wire bonding, bump bonding, or other coupling of additional chips, devices, and/or structures to the thinned substrate 102.

The use of a thinned substrate 102 allows for a higher DQE. Because the thinned substrate 102 is thinned, and in particular, thinned past a point where its structure alone cannot support subsequent processing without damage, an amount of light absorbed by the thinned substrate 102 is reduced. As a result, the amount of the incident illumination reaching the photodetectors 104 is increased.

In some embodiments, an optical transmittance through the thinned substrate 102 to the photodetectors 104 is greater than 50%. To achieve such an optical transmittance, the thinned substrate 102 may be relatively thin.

The optical substrate 130 is a substrate that is configured to allow incident illumination to reach the thinned substrate 102 and hence, the photodetectors 104. In some embodiments, the optical substrate 130 may include a fiber optic plate. In other embodiments, the optical substrate 130 may include a microlens array, a lenticular lens, an optically transparent material such as glass or a transparent ceramic, an optical filter, or the like. In other examples, the optical substrate 130 may be an optical grid or other light channeling structure. In some embodiments, the optical substrate 130 may have a particular density or other characteristic that allows the optical substrate 130 to have a sufficient transmittance of the incident illumination while still having a sufficient structure to support the thinned substrates 102 through manufacturing and use. The optical substrate 130 may be different than the specific examples listed above.

The optical substrate 130 has dimensions and material such that the substrate provides structural support for the thinned substrate 102. In some embodiments, a ratio of the thickness of the optical substrate 130 to a thickness of the thinned substrate 102 may be about 100 to about 1000. However, in other embodiments, the ratio of the thickness may be different. In a particular example, the optical substrate 130 may have a thickness of about 2 mm to about 4 mm while the thinned substrate 102 has a thickness of about 10 μm. Both the thinned substrate 102 and the optical substrate 103 may have similar lengths, widths, and/or diameters; however, because of the increased thickness, the optical substrate 130 may be more rigid than the thinned substrate 102.

The optical substrate 130 is attached to the thinned substrate 102. In particular, the optical substrate 130 is attached to a side of the thinned substrate 102 opposite to a side with the photodetectors 104. An adhesive 132 is used to attach the optical substrate 130 to the thinned substrate 102. Although an adhesive 132 is used as an example, in other embodiments, other techniques may be used to attach the optical substrate 130 to the thinned substrate 102. For example, the thinned substrate 102 may be laminated or otherwise bonded to the optical substrate 130.

The second semiconductor device 120 is attached to the first semiconductor device 101. In some embodiments, the second semiconductor device 120 is attached to the thinned substrate 102 by soldering pads 110 of the thinned substrate 102 to pads 122 of the second semiconductor device 120 using solder 124. As will be described in further detail below, in other embodiments, the second semiconductor device 120 may be attached to the thinned substrate 102 using other attachment techniques.

The second semiconductor device 120 may be any variety of semiconductor chip that may be electrically connected to the first semiconductor device 101. For example, the second semiconductor device 120 may include readout circuits, amplifier circuits, row/column selection circuits, signal routing circuits, image processing circuits, a system-on-a-chip (SOC), or the like. One or more of such circuits may be configured to receive a signal from one or more of the photodetectors 104.

In some embodiments, the side of the thinned substrate 102 opposite to the photodetectors 104 is planar. As a result, a variation across the thinned substrate 102 in the light incident on the photodetectors 104 may be reduced or eliminated. For example, the thinned substrate 102 may absorb some of the incident illumination. The amount absorbed may depend on the thickness of the thinned substrate 102. If the thinned substrate 102 is planar, a variation in the amount of the thinned substrate 102 through which the incident illumination passes through to the photodetectors 104 may be reduced or eliminated and, consequently, the variation in absorption of the incident illumination may be reduced or eliminated. As used herein, planar is flat within manufacturing tolerances of the process used to planarize and/or thin the thinned substrate 102. As a result, planar may include some variation in the surface within those tolerances.

Figure 2A:
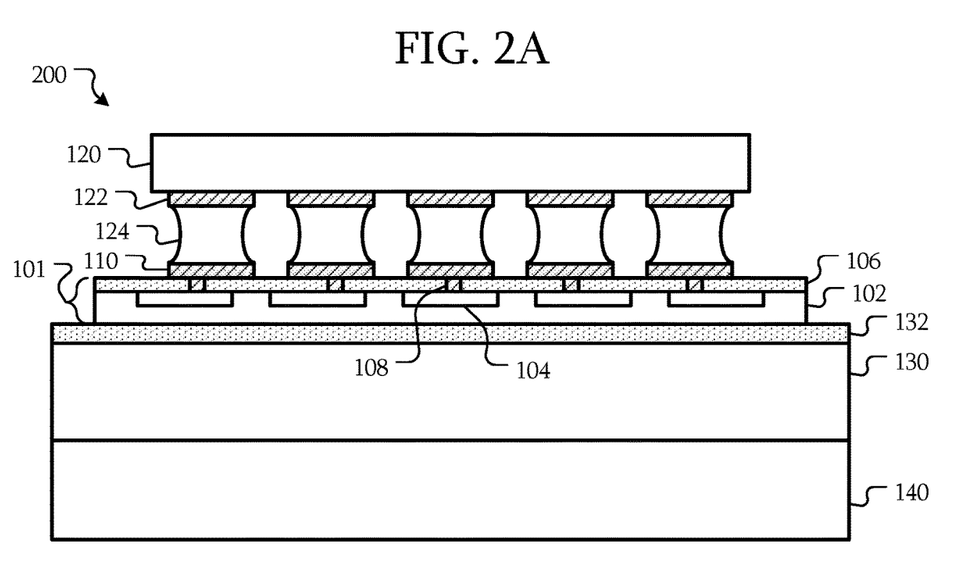
FIG. 2A is a block diagram of a detector using a thinned substrate according to some other embodiments.

FIG. 2A is a block diagram of a detector using a thinned substrate according to some other embodiments. The detector 200 may be similar to the detector 100 of FIG. 1. However, in some embodiments, a scintillator 140 is attached to the optical substrate 130. The scintillator 140 includes a material that converts illumination of one wavelength to another. For example, in some embodiments, the scintillator 140 includes a luminescent or scintillation material which generates visible light when excited by ionizing radiation, such as x-rays (i.e., converts x-ray photons to light). For example, the scintillator 140 may include Cesium Iodide (CsI), gadolinium oxysulfide (GOS or $Gd_2O_2S$), or other materials that may convert an incoming illumination into a wavelength that is more readily detected by the photodetectors 104.

The scintillator 140 may be attached to the optical substrate 130 in a variety of ways. For example, lamination, direct deposition, compression, or the like may be used to attach and/or form the scintillator 140 on the optical substrate 130.

Although a separate scintillator 140 has been used as an example, in some embodiments, a scintillating material may be combined with the optical substrate 130. For example, the optical substrate 130 may be a fiber optic plate with scintillating material within the individual fibers.

Figure 2B:
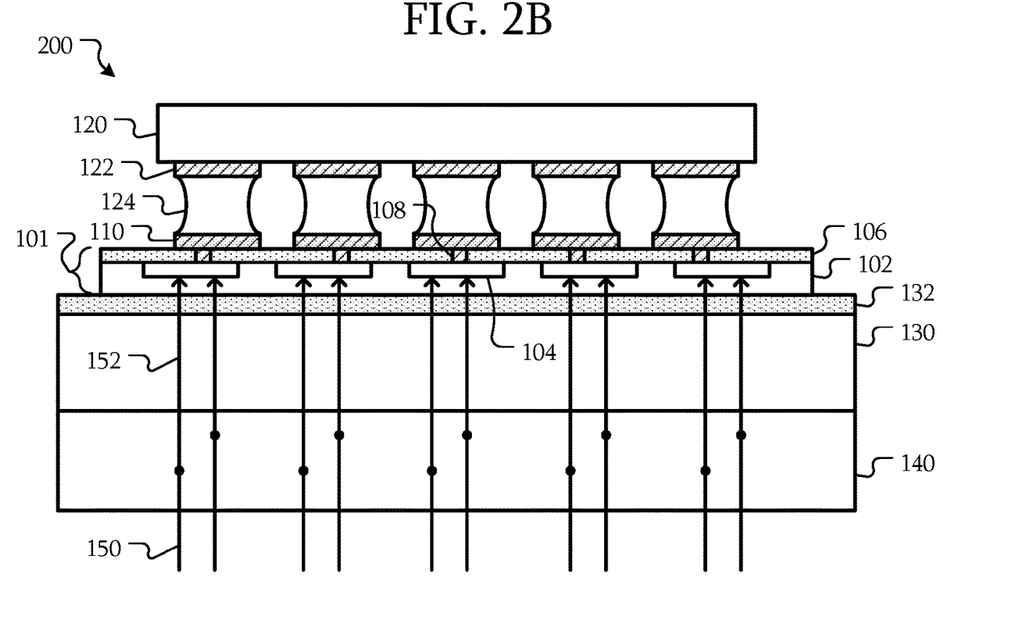
FIG. 2B is a block diagram illustrating a use of the detector of FIG. 2A.

FIG. 2B is a block diagram illustrating a use of the detector of FIG. 2A. In some embodiments, the detector 200 may be used to detect x-rays. For example, incoming x-ray photons 150 are incident on the scintillator 140. The scintillator 140 converts the x-ray photons 150 into photons 152 of visible light or light of another wavelength that may be detected by the photodetectors 104. As the thinned substrate 102 relies on the optical substrate 130 for support and is relatively thin, a smaller amount of the photons 152 are absorbed by the substrate, increasing the DQE.

Although some embodiments have been described with respect to the detection of x-rays, other embodiments include detectors that may be used to detect non-x-ray sources. For example, some embodiments may include photodetectors 104 for detecting visible light infrared light, or ultraviolet light.

Figure 3:
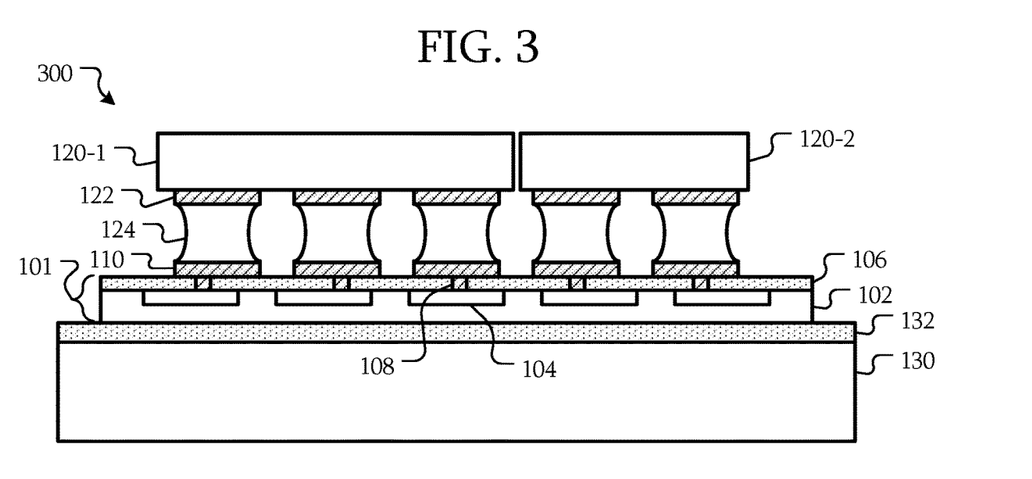
FIG. 3 is a block diagram of a detector using a thinned substrate according to some embodiments.

FIG. 3 is a block diagram of a detector using a thinned substrate according to some embodiments. The detector 300 may be similar to the detectors 100 and 200 described with respect to FIGS. 1-2B. However, in some embodiments, multiple semiconductor devices 120 are attached to the thinned substrate 102. Here, two semiconductor devices 120-1 and 120-2 are used as examples; however, in other embodiments more semiconductor devices 120, any number of semiconductor devices 120, such as hundreds or more discrete semiconductor devices 120, may be attached to the thinned substrate 102.

The semiconductor devices 120 may be separate from each other and, consequently, may not provide structural support to the thinned substrate 102. However, as the optical substrate 130 is providing the support for the thinned substrate 102, the semiconductor devices 120 need not provide that structural support.

The detector 300 may benefit from having multiple smaller semiconductor devices 120 rather than a single semiconductor device 120. For example, if the thinned substrate 102 has a size that is on the order of the size of a wafer, a similarly sized single semiconductor device 120 may be needed to provide circuitry for all of the photodetectors 104 of wafer-sized substrate 120. If that wafer-sized single semiconductor device 120 fails, another wafer-sized single semiconductor device 120 would be needed. However, with multiple chips, each semiconductor device 120 may be smaller. The entire wafer-sized semiconductor device 120 need not be discarded if it fails, only the failed smaller semiconductor device 120.

Figure 4:
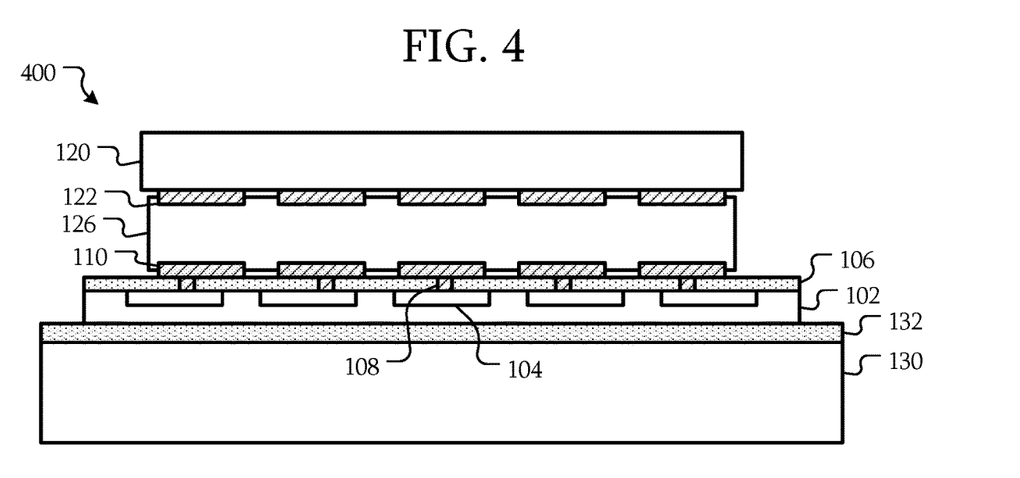
FIG. 4 is a block diagram of a detector using a thinned substrate according to some embodiments.

FIG. 4 is a block diagram of a detector using a thinned substrate according to some embodiments. As described above, other techniques may be used to attach the semiconductor device 120 to the thinned substrate 102. In some embodiments, the detector 400 may be similar to the detectors 100, 200, and 300 or the like as described above. However, in some embodiments, the semiconductor device 120 is not soldered to the thinned substrate 102. In contrast, an anisotropic conducting film (ACF) 126 is disposed between the semiconductor device 120 and the thinned substrate 102. The ACF 126 forms conductive paths between the pads 110 and pads 122. Although soldering and the use of an ACF 126 have been used as examples, in other embodiments, other techniques may be used to attach one or more semiconductor devices 120 to the thinned substrate 102.

Figure 5A:
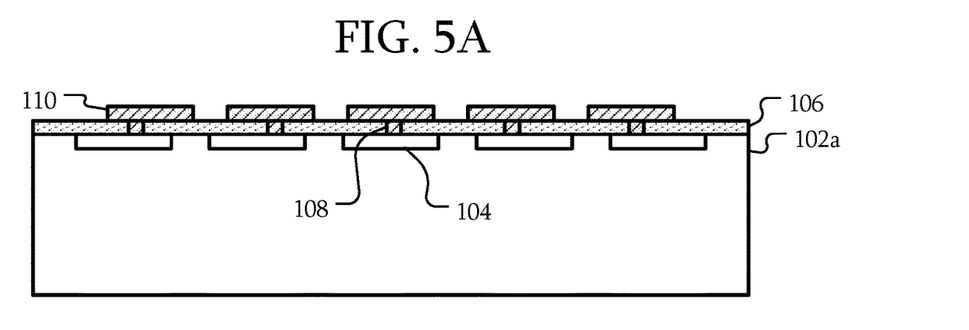
FIGS. 5A-K are block diagrams illustrating techniques of forming a detector according to some embodiments.

FIGS. 5A-G are block diagrams illustrating techniques of forming a detector according to some embodiments. Referring to FIG. 5A, a semiconductor substrate 102a is provided. The semiconductor substrate 102a includes structures similar to the thinned substrate 102 described above. However, the semiconductor substrate 102a may have a thickness that is larger than the thinned substrate 102 described above. For example, the semiconductor substrate 102a may have a thickness that is about 700 µm. Although a particular example has been used, in other embodiments, the thickness of the semiconductor substrate 102a may be different.

Figure 5B:
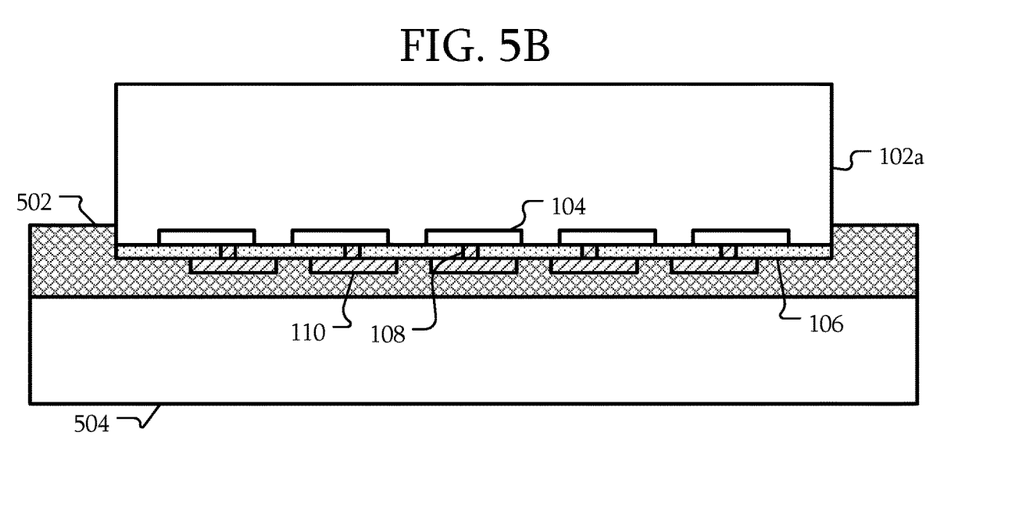

Referring to FIG. 5B, the semiconductor substrate 102a is attached to a carrier substrate 504. The carrier substrate 504 may be a chuck, another wafer, a plate, or the like. In particular, the carrier substrate 504 provides the structural support for at least some of the subsequent processing.

Here, the semiconductor substrate 102a is attached to the carrier substrate 504 using an adhesive 502. The adhesive 502 may be a releasable adhesive. The carrier substrate 504 is attached to the side of the semiconductor substrate 102a that includes the photodetectors 104. In FIG. 5B, the semiconductor substrate 102a is inverted relative to that in FIG. 5A. However, in other embodiments, the orientation may be different.

Figure 5C:
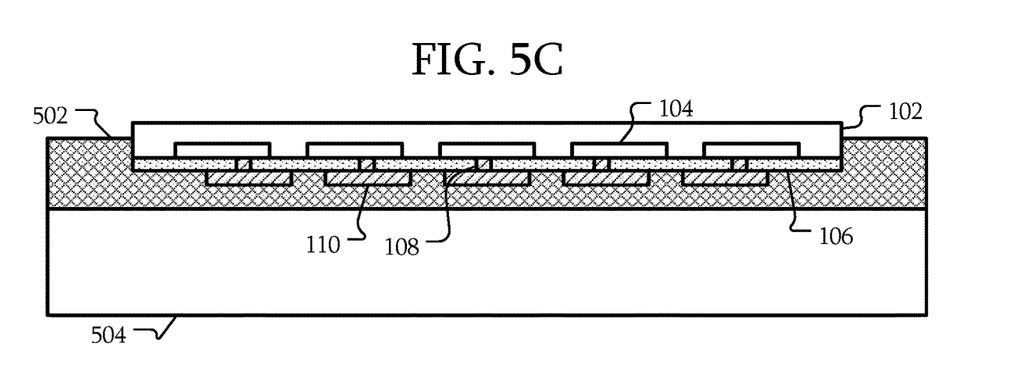

Referring to FIG. 5C, the semiconductor substrate 102a is thinned to form the thinned substrate 102. For example, the semiconductor substrate 102a may be thinned by grinding, chemical mechanical polishing (CMP), etching, or the like. The semiconductor substrate 102a may be reduced in thickness to a desired thickness for the thinned substrate 102. In a particular example, the semiconductor substrate 102a may have a thickness from about 500 µm to about 700 µm. The thickness of the thinned substrate 102 after thinning may be tens of µm or less, such as 10 µm or less or 30 µm or less. The semiconductor substrate 102a may be thinned to a thickness such that the transmittance through the thinned substrate 102 to the photodetectors 104 is greater than a threshold. For example, the threshold may be 50%, 80%, or a different amount.

Figure 5D:
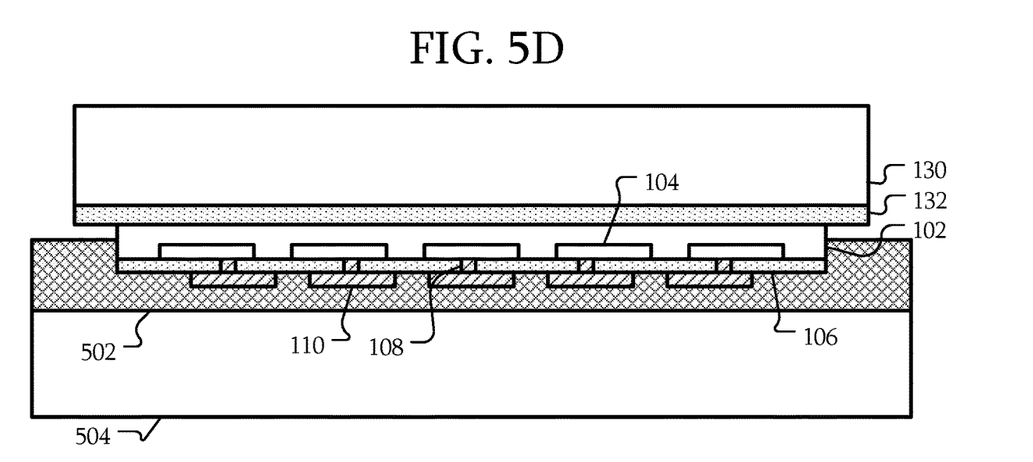

Referring to FIG. 5D, an optical substrate 130 is attached to the thinned substrate 102 while the thinned substrate 102 is attached to the carrier substrate 504. In some embodiments, a fiber optic plate is attached to the thinned substrate 102 as the optical substrate 130. In a particular example, an adhesive 132 is applied to the thinned substrate 102 and/or the optical substrate 130. The thinned substrate 102 and the optical substrate 130 are moved into contact and the adhesive 132 is cured.

Figure 5E:
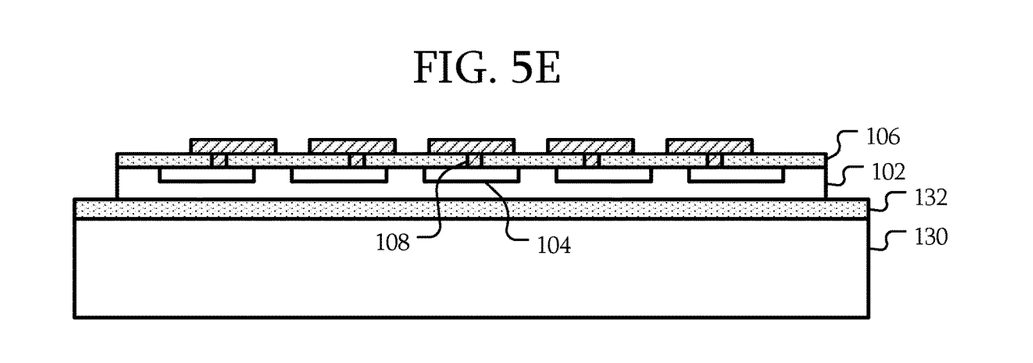

Referring to FIG. 5E, as the thinned substrate 102 was attached to the carrier substrate 504, the carrier substrate 504 provided structural support during the processes of attaching the optical substrate 130. However, the optical substrate 130 may now provide sufficient structural support for the thinned substrate 102 during further processing. Accordingly, the carrier substrate 504 is removed.

Referring to FIGS. 1 and 3, in some embodiments, after removing the carrier substrate 504 from the thinned substrate 102, one or more semiconductor devices 120 may be added. For example, a single semiconductor device 120 may be attached to the thinned substrate 102 by soldering pads 110 and 122 together. In other embodiments, semiconductor devices 120-1 and 120-2 may be similarly soldered to the thinned substrate 102. In another example, one or more semiconductor devices 120 may be attached to the thinned substrate 102 using the ACF 126 as described with respect to FIG. 4.

Figure 5F:
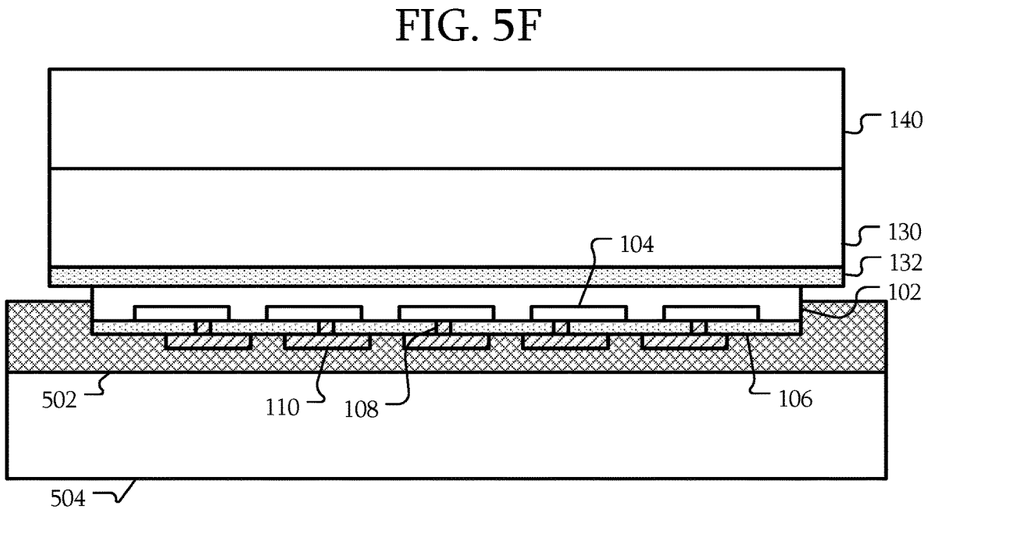

Referring to FIG. 5F, in some embodiments, a scintillator 140 may be attached to the optical substrate 130 while the thinned substrate 102 is attached to the carrier substrate 504. The scintillator 140 may be attached by an adhesive, the scintillator 140 may be deposited or evaporated, or other similar techniques may be used to attach the scintillator 140 to the optical substrate 130. The carrier substrate 504 may then be removed and semiconductor devices 120 may be mounted on the thinned substrate 102. An example of a resulting structure is that of FIG. 2A.

In some embodiments, the scintillator 140 may be attached to the optical substrate 130 before the optical substrate 130 is attached to the thinned substrate 102. Accordingly, the combined optical substrate 130 and scintillator 140 may be added to the structure of FIG. 5C to generate the structure of FIG. 5F.

Figure 5G:
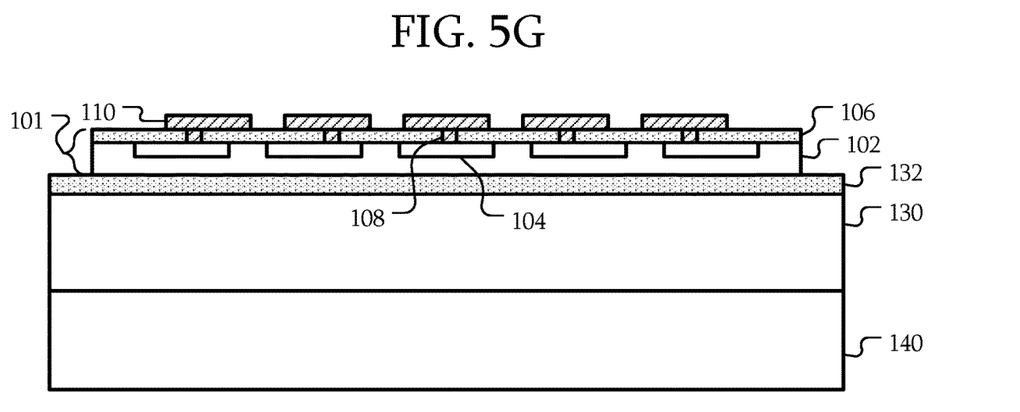

Referring to FIG. 5G, in some embodiments, a scintillator 140 may be added to the structure of FIG. 5E. That is, the scintillator 140 may be attached after the carrier substrate 504 is removed from the thinned substrate 102. Semiconductor devices 120 may be mounted on the thinned substrate 102. An example of a resulting structure is that of FIG. 2A.

Figure 5H:
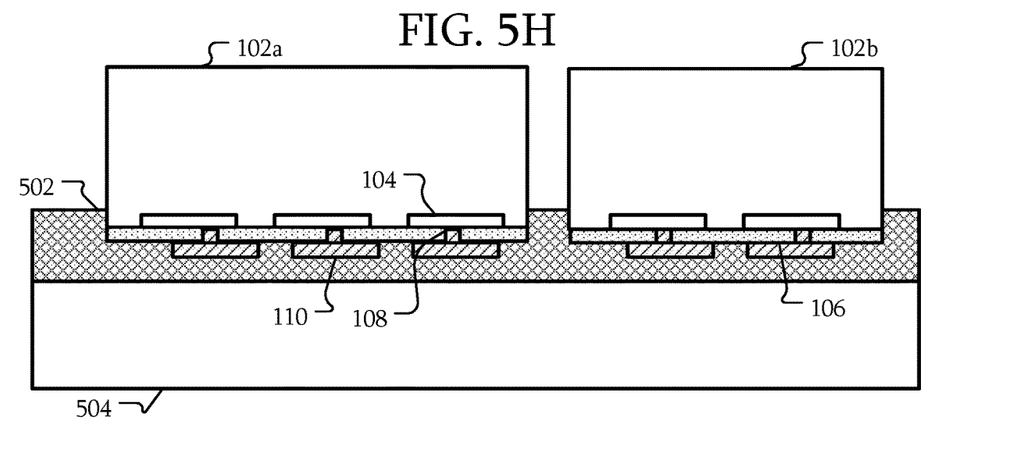

Referring to FIG. 5H, in some embodiments, multiple semiconductor substrates may be attached to the carrier substrate 504. In this example, two semiconductor substrates 102a and 102b are used as examples; however, in other embodiments, more semiconductor substrates may be attached to the carrier substrate 504. These semiconductor substrates 102a and 102b may be attached similar to the single semiconductor substrate 102a described with respect to FIG. 5B.

Figure 5I:
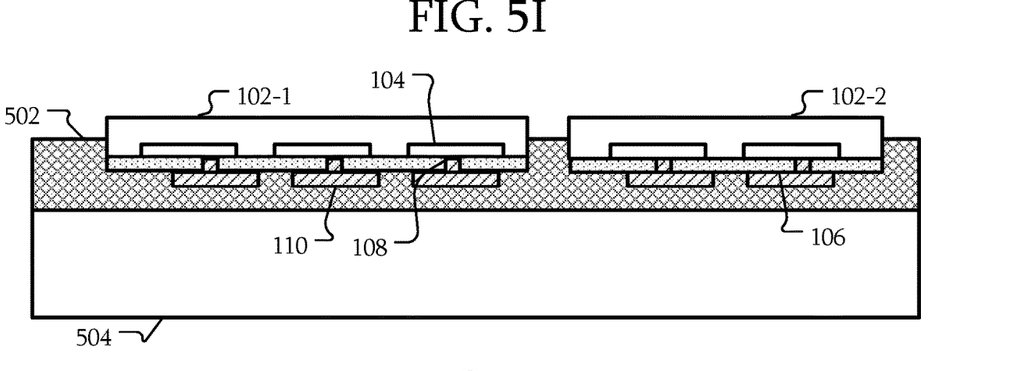

Referring to FIG. 5I, in some embodiments, the semiconductor substrates 102a and 102b are thinned to form the thinned substrates 102-1 and 102-2. The semiconductor substrates 102a and 102b may be thinned as described with respect to FIG. 5C. At this point, both of the thinned substrates 102-1 and 102-2 are structurally supported by the carrier substrate 504. Although attaching and thinning multiple semiconductor substrates at the same time has been used as an example, in other embodiments, multiple semiconductor substrates may each be attached and thinned sequentially.

Figure 5J:
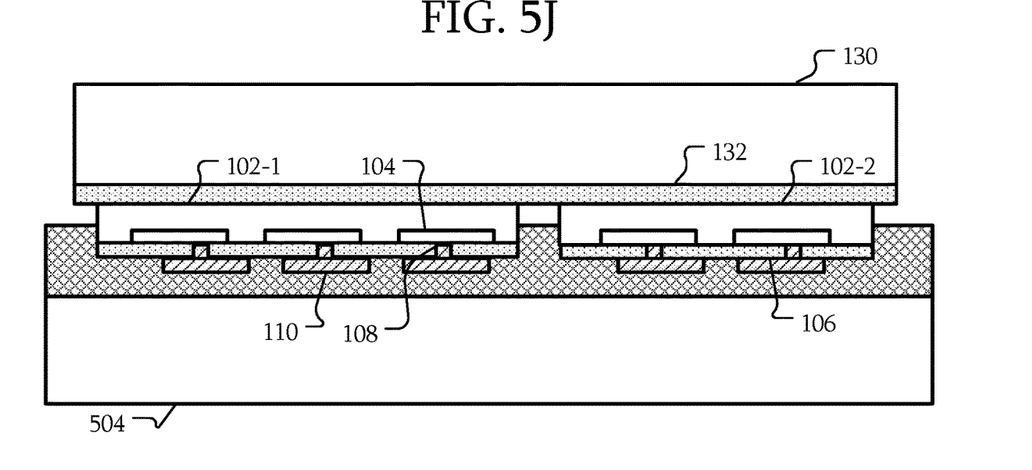

Referring to FIG. 5J, in some embodiments, an optical substrate 130 is attached to thinned substrates 102-1 and 102-2. The optical substrate 130 may be attached as described with respect to FIG. 5D.

Figure 5K:
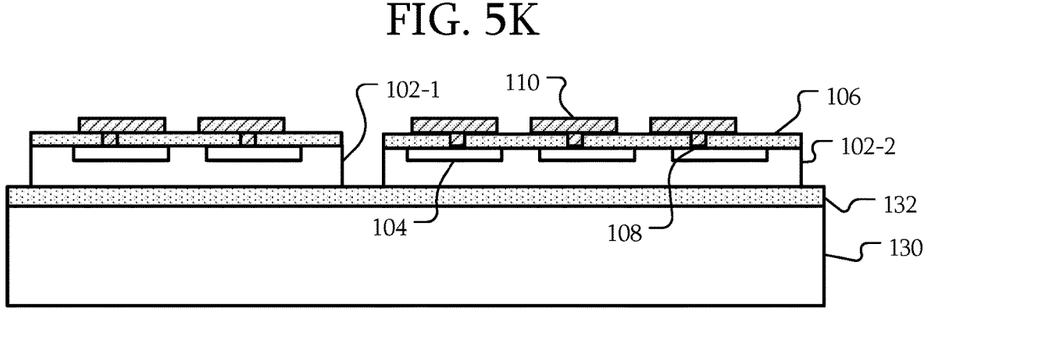

Referring to FIG. 5K, in some embodiments, the carrier substrate 504 is removed. Accordingly, the resulting structure is similar to that of FIG. 5E. However, multiple thinned substrates 102 are attached to the optical substrate 130. The optical substrate 130 is providing structural support for each of the thinned substrates 102. From this point, one or more semiconductor devices 120, a scintillator 140, or the like may be attached to the thinned substrates 102 similar to the single or multiple semiconductor devices of FIGS. 1-4, 5F, and 5G.

Figure 6A:
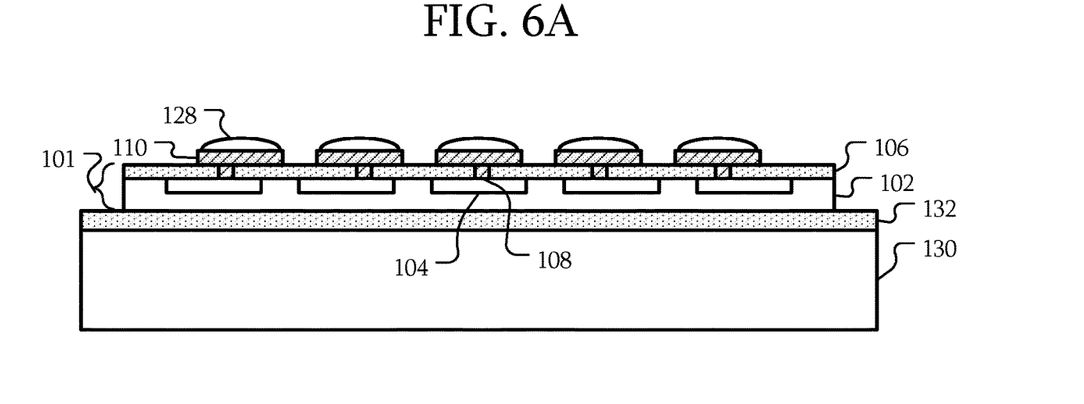
FIGS. 6A-B are block diagrams illustrating a technique of reworking a detector according to some embodiments.

FIGS. 6A-B are block diagrams illustrating a technique of reworking a detector according to some embodiments. Referring to FIGS. 1 and 6A, in some embodiments, the semiconductor device 120 may be desoldered and removed from the thinned substrate 102. A remainder 128 of the solder 124 may remain on the surface of the pads 110; however, the remainder 128 is only representative of the removal of the semiconductor device 120. In some embodiments, no remainder 128 may be present after removing the semiconductor device 120.

Because the optical substrate 130 provides structural support for the thinned substrate 102, the semiconductor device 120 may be removed. That is, without the semiconductor device 120, the thinned substrate 102 still has sufficient structural support. In a later process, another semiconductor device 120 may be attached. In contrast, if the semiconductor device 120 formed the structural support for the substrate 102, the semiconductor device 120 could not have been removed without additional processing.

Figure 6B:
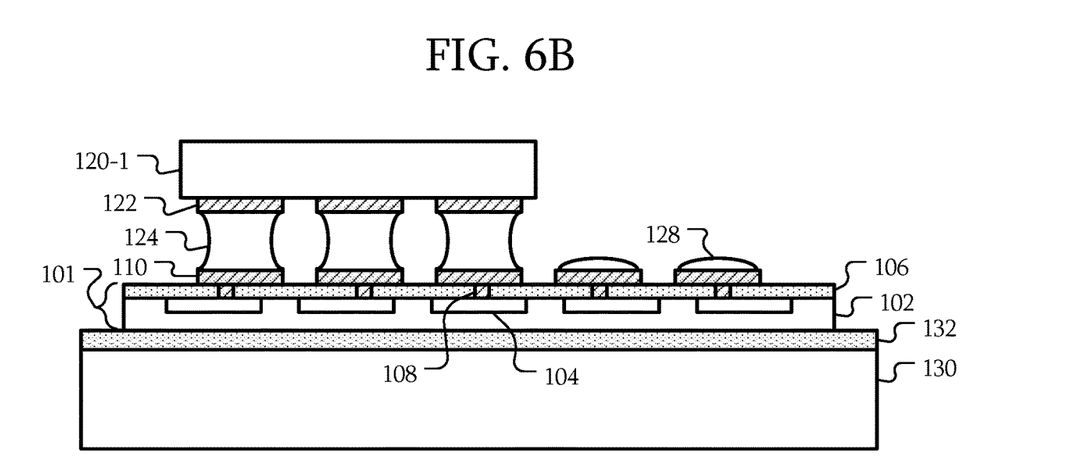

Referring to FIGS. 3 and 6B, in some embodiments, one or more of multiple semiconductor devices 120 may be desoldered and removed from the thinned substrate 102 as similarly described with respect to FIG. 6A. In some embodiments, less than all of the semiconductor devices 120 may be removed. Here, one of the two semiconductor devices 120 was removed. A new semiconductor device 120 may be attached as a replacement.

Figure 7:
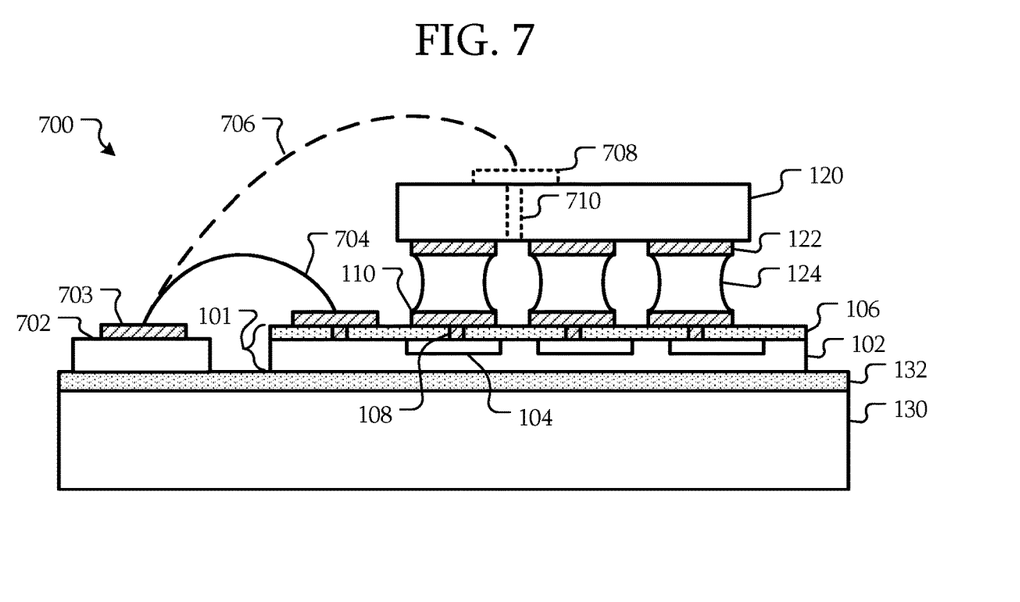
FIG. 7 is a block diagram of a detector using a thinned substrate according to some embodiments.

FIG. 7 is a block diagram of a detector according to some embodiments. The detector 700 may be similar to the detector 100, 200, 300, 400, or the like as described above. However, the detector 700 includes a semiconductor device 702 attached to the optical substrate 130. The semiconductor device 702 is electrically connected to the thinned substrate 102. Here, a bonding wire 704 is used to electrically connect a pad 703 of the semiconductor device 702 to a pad 110 on the thinned substrate 102; however, in other embodiments, different techniques may be used. Accordingly, the optical substrate 130 may serve as the support for the semiconductor device 702 in addition to providing structural support for the thinned substrate 102.

In some embodiments, the semiconductor device 702 may be electrically connected to one or more semiconductor devices 120. Here, a dashed line illustrates a connection by a bonding wire 706 to a semiconductor device 120. For example, the bonding wire may be attached to a pad 708. The pad 708 may be electrically connected to a circuit within the semiconductor device 120, such as through a through silicon via (TSV) 710. In some embodiments, the semiconductor device 702 is electrically connected to both the thinned substrate 102 and the semiconductor device 120. Although a single semiconductor device 702 is used as an example, in other embodiments, more semiconductor devices 702 may be attached to the optical substrate 130 and electrically connected to the thinned substrate 102 and/or one or more semiconductor device 120.

In some embodiments, the semiconductor device 702 may be attached and thinned similar to the semiconductor devices 102 described above with respect to FIGS. 5H-K. However, in other embodiments, the semiconductor device 702 may be attached to the optical substrate 130 in a different process. Furthermore, the semiconductor device 702 may, but need not be thinned. For example, if the semiconductor device 702 does not have photodetectors or other circuits that benefit from a lower absorption of a thinner substrate, a substrate of the semiconductor device 702 may not be thinned.

Figure 8:
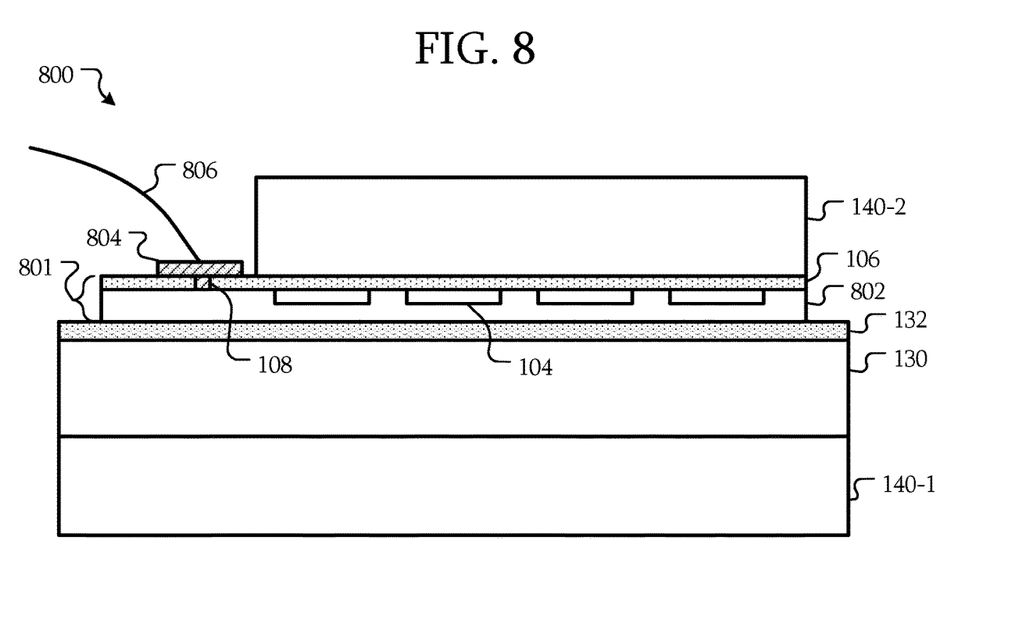
FIG. 8 is a block diagram of a detector with scintillators on two sides according to some embodiments.

FIG. 8 is a block diagram of a detector with scintillators on two sides according to some embodiments. The detector 800 may be similar to the detector 100, 200, 300, 400, 700, or the like as described above. However, in some embodiments, the detector 800 includes a thinned substrate 802 similar to the thinned substrate 102, but without pads such as pads 110 to electrically connect to semiconductor devices 120 to the thinned substrate 802. The thinned substrate 802 may include circuitry such as readout circuits, amplifier circuits, row/column selection circuits, signal routing circuits, image processing circuits, a system-on-a-chip (SOC), or the like. The thinned substrate 802 may include pads 804 for electrical connection to the circuitry within the substrate 802. Here a bond wire 806 is used as an example; however, in other embodiments, other techniques may be used to electrically connect to the thinned substrate 802.

Accordingly, a second scintillator 140-2 may be attached to the thinned substrate 802 or otherwise disposed on a side of the thinned substrate 802 opposite to the scintillator 140-1. As a result, the detector 800 may be configured to receive illumination from two sides.

Although a single thinned substrate 102 has been used as an example, in other embodiments, multiple thinned substrates 102, such as those described with respect to FIGS. 5H-K may be used in place of the single thinned substrate 102/802 of FIGS. 6A-8.

Figure 9:
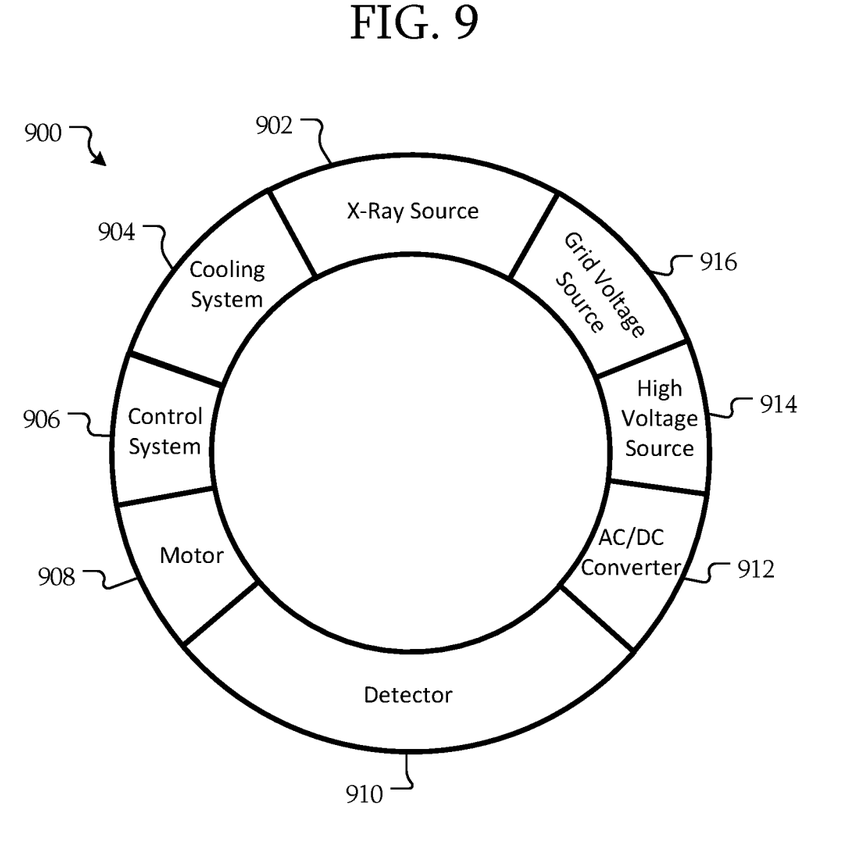
FIG. 9 is a block diagram of a computerized tomography (CT) gantry according to some embodiments.

FIG. 9 is a block diagram of a computerized tomography (CT) gantry according to some embodiments. In some embodiments, the CT gantry includes an x-ray source 902, a cooling system 904, a control system 906, a motor drive 908, a detector 910, an AC/DC converter 912, a high voltage source 914, and a grid voltage source 916. The detector 910 may include a detector, a thinned substrate, or the like as described above. Although particular components have been used as examples of components that may be mounted on a CT gantry, in other embodiments, the other components may be different. Although a CT gantry is used as an example of a system that includes a detector as described herein, detectors described herein may be used in other types of systems.

Figure 10:
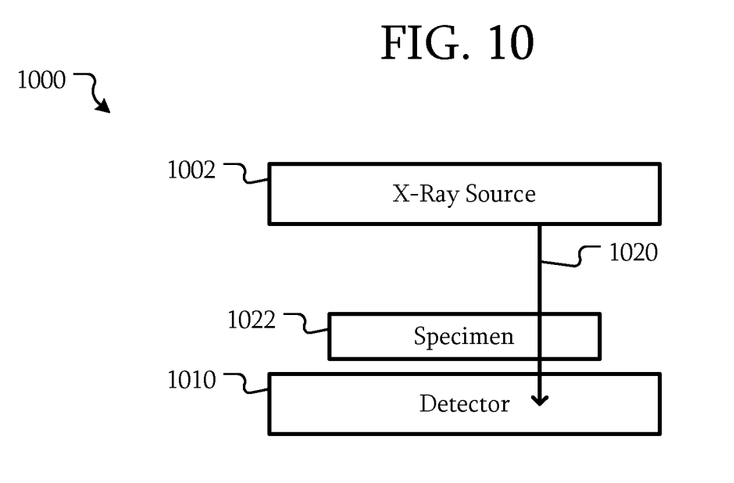
FIG. 10 is a block diagram of a 2D x-ray imaging system according to some embodiments.

FIG. 10 is a block diagram of a 2D x-ray imaging system according to some embodiments. The imaging system 1000 includes an x-ray source 1002 and a detector 1010. The detector 1010 may include a detector, a thinned substrate, or the like as described above. The x-ray source 1002 is disposed relative to the detector 1010 such that a x-rays 1020 may be generated to pass through a specimen 1022 and detected by the detector 1010.

Some embodiments include a computer readable medium storing instructions that, when executed, cause the computer to perform one or more of the operations described above. For example, such instructions may include instructions for forming a detector.

Referring to FIGS. 5A-K, some embodiments include a method, comprising: attaching a carrier substrate 504 to a side of at least one semiconductor substrate 102a, the at least one semiconductor substrate 102a including photodetectors 104 on the side; thinning the at least one semiconductor substrate 102a while the at least one semiconductor substrate 102 is attached to the carrier substrate 504; attaching an optical substrate 130 to the at least one semiconductor substrate 102 while the at least one semiconductor substrate 102 is attached to the carrier substrate 504; and removing the carrier substrate 504 from the at least one semiconductor substrate 102.

In some embodiments, the optical substrate 130 includes a fiber optic plate.

In some embodiments, the method further comprises attaching a semiconductor device 120 to the side of the at least one semiconductor substrate 102 after removing the carrier substrate 504 from the at least one semiconductor substrate 102.

In some embodiments, the method further comprises removing the semiconductor device 120 from the side of the at least one semiconductor substrate 102.

In some embodiments, the semiconductor device 120 includes a circuit configured to receive a signal from at least one of the photodetectors 104.

In some embodiments, the method further comprises attaching a plurality of semiconductor devices 120 to the at least one semiconductor substrate 102 after removing the carrier substrate 504 from the at least one semiconductor substrate 102.

In some embodiments, the method further comprises attaching a scintillator 140 to the optical substrate 130.

In some embodiments, thinning the at least one semiconductor substrate 102 comprises thinning the at least one semiconductor substrate 102 to a thickness less than 30 μm.

In some embodiments, wherein the at least one semiconductor substrate comprises a plurality of semiconductor substrates.

Referring to FIGS. 1-4, 7, and 8, some embodiments include a system, comprising: a semiconductor substrate 102 including a plurality of pads and a plurality of photodetectors 104 coupled to the pads on a first side of the semiconductor substrate 102; an optical substrate 130 attached to a second side of the semiconductor substrate 102 opposite to the first side; and a plurality of semiconductor devices 120 attached to the semiconductor substrate 102.

In some embodiments, the optical substrate 130 includes a fiber optic plate.

In some embodiments, the system further comprises a scintillator 140 attached to the optical substrate 130.

In some embodiments, the scintillator 140 is referred to as a first scintillator 140; and the system further comprises a second scintillator 140 attached to the first side the semiconductor substrate 102.

In some embodiments, at least one of the semiconductor devices 120 includes circuitry configured to receive a signal from one of the photodetectors 104.

In some embodiments, the semiconductor substrate 102 has a thickness less than 30 μm.

In some embodiments, an optical transmittance through the semiconductor substrate 102 to the photodetectors 104 is greater than 50%.

In some embodiments, the semiconductor substrate is a first semiconductor substrate of a plurality of semiconductor substrates; a second semiconductor substrate of the plurality of semiconductor substrates includes a plurality of pads and a plurality of photodetectors coupled to the pads on a first side of the second semiconductor substrate; and the optical substrate is attached to a second side of the second semiconductor substrate opposite to the first side of the second semiconductor substrate.

Referring to FIG. 9, in some embodiments, the system is included in a detector 910 of computerized tomographic system 900.

In some embodiments, the second side of the semiconductor substrate 102 is planar.

Referring to FIG. 7, in some embodiments, the semiconductor devices 120 are referred to as first semiconductor devices 120; and the system further comprises a second semiconductor device 702 attached to the optical substrate 130 and electrically connected to at least one of the semiconductor substrate 102 and the first semiconductor devices 120.

Some embodiments include a system, comprising: means for detecting incident illumination; means for supporting the means for detecting incident illumination and for optically affecting the incident illumination; and a plurality of means for processing the detected incident illumination; wherein the plurality of means for processing the detected incident illumination are attached to the means for detecting the incident illumination.

Examples of the means for detecting incident illumination include the photodetectors 104 and the thinned substrate or substrates 102.

Examples of the means for supporting the means for detecting incident illumination and for optically affecting the incident illumination include the optical substrate 130 and the scintillator 140.

Examples of the plurality of means for processing the detected incident illumination include the semiconductor devices 120.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments;

claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112 ¶ 6. Embodiments of the invention in which an exclusive property or privilege is claimed are defined as follows.

The invention claimed is:

1. A method, comprising:
    attaching a carrier substrate to a side of at least one semiconductor substrate, the at least one semiconductor substrate including photodetectors on the side;
    thinning the at least one semiconductor substrate while the at least one semiconductor substrate is attached to the carrier substrate;
    attaching an optical substrate to the at least one semiconductor substrate while the at least one semiconductor substrate is attached to the carrier substrate;
    removing the carrier substrate from the at least one semiconductor substrate; and
    attaching at least one semiconductor device to the side of the at least one semiconductor substrate after removing the carrier substrate from the at least one semiconductor substrate.

2. The method of claim 1, wherein the optical substrate includes a fiber optic plate.

3. The method of claim 1, further comprising removing one of the at least one semiconductor device from the side of the at least one semiconductor substrate.

4. The method of claim 1, wherein the semiconductor device includes a circuit configured to receive a signal from at least one of the photodetectors.

5. The method of claim 1, wherein attaching the at least one semiconductor device to the side of the at least one semiconductor substrate comprises attaching a plurality of separate semiconductor chips to the at least one semiconductor substrate after removing the carrier substrate from the semiconductor substrate.

6. The method of claim 1, further comprising attaching a scintillator to the optical substrate.

7. The method of claim 1, wherein thinning the at least one semiconductor substrate comprises thinning the at least one semiconductor substrate to a thickness less than 30 µm.

8. The method of claim 1, wherein:
    the at least one semiconductor substrate comprises a plurality of semiconductor substrates;
    attaching the carrier substrate comprises attaching the carrier substrate to a side of each of the semiconductor substrates; and
    attaching an optical substrate comprises attaching the optical substrate to the semiconductor substrates while the semiconductor substrates are attached to the carrier substrate.

9. A computer readable medium having instructions stored thereon adapted to perform the method of claim 1.

10. A system, comprising:
    a semiconductor substrate including a plurality of pads and a plurality of photodetectors coupled to the pads on a first side of the semiconductor substrate;
    an optical substrate attached to a second side of the semiconductor substrate opposite to the first side; and
    a plurality of separate semiconductor chips separately attached to the pads of the semiconductor substrate.

11. The system of claim 10, wherein the optical substrate includes a fiber optic plate.

12. The system of claim 10, further comprising a scintillator attached to the optical substrate.

13. The system of claim 10, wherein at least one of the separate semiconductor chips includes circuitry configured to receive a signal from at least one of the photodetectors.

14. The system of claim 10, wherein the semiconductor substrate has a thickness less than 30 µm.

15. The system of claim 10, wherein an optical transmittance through the semiconductor substrate to the photodetectors is greater than 50%.

16. The system of claim 10, wherein:
    the semiconductor substrate is a first semiconductor substrate of a plurality of semiconductor substrates;
    a second semiconductor substrate of the plurality of semiconductor substrates includes a plurality of pads and a plurality of photodetectors coupled to the pads on a first side of the second semiconductor substrate; and
    the optical substrate is attached to a second side of the second semiconductor substrate opposite to the first side of the second semiconductor substrate.

17. The system of claim 10, wherein the second side of the semiconductor substrate is planar.

18. The system of claim 10, wherein:
    the semiconductor chips are referred to as first semiconductor chips; and
    the system further comprises a second semiconductor chip attached to the optical substrate and electrically connected to at least one of the semiconductor substrate and the first semiconductor chips.

19. A system, comprising:
    means for detecting incident illumination;
    means for supporting the means for detecting incident illumination and for optically affecting the incident illumination;
    a plurality of means for processing the detected incident illumination; and
    a plurality of means for electrically connecting the means for detecting incident illumination to the plurality of means for processing the detected incident illumination;
    wherein each of the plurality of means for processing the detected incident illumination is separately attached to the means for detecting the incident illumination.

20. The system of claim 10, further comprising:
    a plurality of vias formed in the semiconductor substrate;
    wherein the photodetectors are coupled to the pads of the semiconductor substrate and to the separate semiconductor chips through the vias.

* * * * *